United States Patent
Lee et al.

(10) Patent No.: US 9,570,521 B2
(45) Date of Patent: Feb. 14, 2017

(54) BIDIRECTIONAL DISPLAY DEVICE

(71) Applicant: SAMSUNG DISPLAY CO., LTD., Yongin-si, Gyeonggi-do (KR)

(72) Inventors: Tae Hee Lee, Gumi-si (KR); Yi Joon Ahn, Seoul (KR); Yong Suk Yeo, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 63 days.

(21) Appl. No.: 14/566,302

(22) Filed: Dec. 10, 2014

(65) Prior Publication Data

US 2016/0011442 A1   Jan. 14, 2016

(30) Foreign Application Priority Data

Jul. 14, 2014   (KR) .................. 10-2014-0088233

(51) Int. Cl.
| | |
|---|---|
| *G02F 1/1333* | (2006.01) |
| *H01L 27/32* | (2006.01) |
| *G06F 1/16* | (2006.01) |
| *F21V 8/00* | (2006.01) |

(52) U.S. Cl.
CPC ......... *H01L 27/3225* (2013.01); *G06F 1/1605* (2013.01); *G02B 6/0063* (2013.01); *H01L 27/3267* (2013.01)

(58) Field of Classification Search
CPC ... G06F 1/1601; H01L 27/3267; G02B 6/0063
See application file for complete search history.

(56) References Cited

U.S. PATENT DOCUMENTS

| | | | |
|---|---|---|---|
| 2005/0018868 A1* | 1/2005 | Chick ................. | H04R 1/2834 381/349 |
| 2005/0215296 A1* | 9/2005 | Fujihara ............... | H04M 1/021 455/575.3 |
| 2008/0074899 A1* | 3/2008 | Wang ................... | G02B 6/0035 362/600 |
| 2008/0175416 A1 | 7/2008 | Suzuki et al. | |
| 2009/0298547 A1* | 12/2009 | Kim .................... | H04W 52/027 455/566 |
| 2010/0290650 A1 | 11/2010 | Ogura et al. | |
| 2011/0085684 A1 | 4/2011 | Kim et al. | |
| 2011/0128245 A1* | 6/2011 | Andoh ................ | H04R 17/005 345/173 |
| 2011/0213271 A1* | 9/2011 | Telfort ................ | A61B 7/003 600/586 |
| 2012/0169967 A1 | 7/2012 | Han et al. | |

(Continued)

FOREIGN PATENT DOCUMENTS

| | | |
|---|---|---|
| JP | 2006-050309 | 2/2006 |
| JP | 2008-079179 | 4/2008 |
| KR | 10-2012-0078923 | 7/2012 |

*Primary Examiner* — Sang V Nguyen
(74) *Attorney, Agent, or Firm* — Innovation Counsel LLP

(57) ABSTRACT

A display device includes: a first display panel and a second display panel disposed to face each other; a backlight unit interposed between the first display panel and the second display panel; and a speaker unit including a first piezoelectric module and a second piezoelectric module sharing an enclosure and disposed to face each other, a first output unit configured to output sound produced from the first piezoelectric module, and a second output unit configured to output sound produced from the second piezoelectric module.

16 Claims, 4 Drawing Sheets

(56) References Cited

U.S. PATENT DOCUMENTS

| | | | | |
|---|---|---|---|---|
| 2013/0281152 | A1* | 10/2013 | Nishimura | H04M 1/026 |
| | | | | 455/550.1 |
| 2014/0036431 | A1* | 2/2014 | Sasaki | B06B 1/0648 |
| | | | | 361/679.21 |
| 2014/0241558 | A1* | 8/2014 | Yliaho | H04R 5/02 |
| | | | | 381/333 |
| 2014/0313137 | A1* | 10/2014 | Cho | G06F 3/041 |
| | | | | 345/173 |
| 2014/0375702 | A1* | 12/2014 | Cho | G06F 1/3265 |
| | | | | 345/690 |
| 2015/0301738 | A1* | 10/2015 | Nishigaki | H04M 1/67 |
| | | | | 715/716 |
| 2015/0341714 | A1* | 11/2015 | Ahn | G06F 1/1688 |
| | | | | 381/333 |
| 2016/0034057 | A1* | 2/2016 | Ikeda | H04M 1/03 |
| | | | | 345/173 |

* cited by examiner

BIDIRECTIONAL DISPLAY DEVICE

CROSS-REFERENCE TO RELATED APPLICATION

This application claims priority to and the benefit of Korean Patent Application No. 10-2014-0088233, filed on Jul. 14, 2014, with the Korean Intellectual Property Office, the disclosure of which is incorporated herein in its entirety by reference.

BACKGROUND

1. Field

The present disclosure relates to a bidirectional display device bidirectionally outputting images and sound.

2. Description of the Related Art

Liquid crystal displays (LCD) are a type of flat panel display (FPD that are most widely used these days. An LCD includes two substrates that have electrodes formed thereon, and a liquid crystal layer interposed between the two substrates. Upon applying voltage to the electrodes, liquid crystal molecules of the liquid crystal layer are rearranged, thereby adjusting an amount of transmitted light, to display an image.

Unlike LCD devices, display devices using an organic light emitting diode (OLED) do not require a backlight unit for light emission, and are capable of being manufactured to have a thin film form that has a multi-layer laminated structure, thereby possessing excellent flexibility. Such an OLED device has drawn attention not only for use in flat panel display devices, but also for use in flexible panel display devices.

These display devices have generally provided images or sound in one direction. However, in recent years, there has been increasing emphasis on research into bidirectional display devices that can display the same image or different images in two different directions in order to efficiently provide a variety of information in public areas and the like.

A conventional bidirectional display device bidirectionally displays the same image or different images on different display panels but simultaneously outputs sounds for the respective images from one speaker in only one direction. Therefore, it has been difficult to provide users with corresponding sound matching with each image.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

A bidirectional display device that is capable of respectively outputting sounds of bidirectionally displayed images in the same direction as the respective bidirectionally displayed images and includes a speaker capable of outputting sound in a variety of modes using an enclosure is provided.

According to one aspect, a display device may include: a first display panel and a second display panel disposed to face each other; a backlight unit interposed between the first display panel and the second display panel; and a speaker unit including a first piezoelectric module and a second piezoelectric module sharing an enclosure and disposed to face each other, a first output unit configured to output sound produced from the first piezoelectric module, and a second output unit configured to output sound produced from the second piezoelectric module.

The first display panel and the second display panel may include: a first substrate; a second substrate disposed to face the first substrate; and a liquid crystal layer interposed between the first substrate and the second substrate.

The backlight unit may include: a first optical sheet and a second optical sheet; a light guide plate interposed between the first optical sheet and the second optical sheet; and a light source disposed on one side of the light guide plate.

The first optical sheet and the second optical sheet may include at least one of a diffusion sheet, a prism sheet, and a protective sheet and the light source may include at least one LED.

The first piezoelectric module and the second piezoelectric module may include: a lower electrode; an upper electrode; and a piezoelectric element disposed between the lower electrode and the upper electrode.

The first piezoelectric module and the second piezoelectric module may be electrically connected to the first display panel and the second display panel, respectively, and the piezoelectric element may vibrate according to voltage applied to the upper electrode and the lower electrode and produce a plurality of sounds.

The first output unit and the second output unit may be disposed to face each other.

The first output unit and the second output unit may be alternately disposed.

The first display panel may display an image toward a first direction and the first output unit may output sound in the first direction.

The second display panel may display an image toward a second direction and the second output unit may output sound the second direction.

The first display panel and the first output unit may face a first direction and the second display panel and the second output unit may face a second direction different from the first direction.

According to an embodiment of the present invention, a display device may include: a first display panel and a second display panel disposed to face each other; and a speaker unit including a first piezoelectric module and a second piezoelectric module sharing an enclosure and disposed to face each other, a first output unit configured to output sound produced from the first piezoelectric module, and a second output unit configured to output sound produced from the second piezoelectric module.

The first display panel and the second display panel may include: a substrate; a display layer disposed on the substrate and including an organic light emitting diode; and a thin film encapsulation layer disposed to cover the display layer.

The first piezoelectric module and the second piezoelectric module may include: a lower electrode; an upper electrode; and a piezoelectric element disposed between the lower electrode and the upper electrode.

The first piezoelectric module and the second piezoelectric module may be electrically connected to the first display panel and the second display panel, respectively, and the piezoelectric element may vibrate according to voltage applied to the upper electrode and the lower electrode and produce a plurality of sounds.

The first output unit and the second output unit may be disposed to face each other.

The first output unit and the second output unit may be alternately disposed.

According to embodiments of the present invention, the respective sounds for bidirectionally displayed images are outputted from a plurality of piezoelectric modules sharing an enclosure in a direction the same as the images, thereby providing users with corresponding sound matching with each image.

Further, according to embodiments of the present invention, the enclosure is formed in a speaker unit, thereby capable of outputting sound in a variety of modes, such as mono and stereo, and outputting sound having a variety of tones by utilizing the enclosure as a woofer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
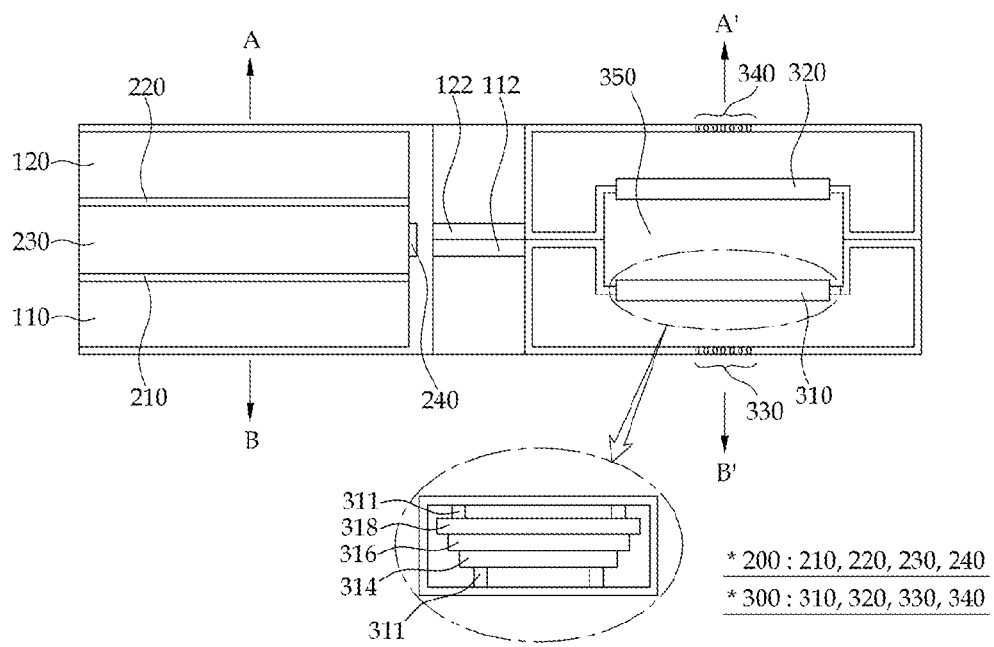
FIG. 1 is a cross-sectional plan view illustrating a bidirectional display device according to an embodiment.

Advantages and features of the present disclosure and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough, and will convey the scope of the disclosure to those skilled in the art. Therefore, well-known constituent elements, operations and techniques are not described in detail in the embodiments. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Referring to FIG. 1, a bidirectional display device according to an embodiment includes a first and a second display panels 110 and 120 disposed to face each other, a backlight unit 200 interposed between the first and the second display panels 110 and 120, and a speaker unit 300 disposed on one side of the backlight unit 200.

Although not illustrated in the drawings, the first and the second display panels 110 and 120 include a first substrate, a second substrate disposed to face the first substrate, and a liquid crystal layer interposed between the first and the second substrates.

The first and the second substrates may be transparent or opaque insulating substrates, such as a silicon substrate, a glass substrate, a plastic substrate, and the like.

The first substrate may include a pixel electrode formed of a transparent conductive material, a thin film transistor (TFT) applying a driving voltage to the pixel electrode, and a variety of signal lines configured to drive the pixel electrode and the thin film transistor, such as gate lines and date lines.

The second substrate may include a common electrode formed of a transparent conductive material, a color filter, gate lines and data lines, and a black matrix (BM) configured to hide a thin film transistor and the like.

However, embodiments are not limited thereto, and thus both of the pixel electrode and the common electrode may be disposed on one of the first and the second substrates or both of the color filter and the BM may be disposed on the first substrate.

That is, in a case where the thin film transistors connected to the respective gate lines are turned on by a gate voltage applied to the gate lines, a data voltage applied to the data lines are transmitted to the pixel electrode. Then, the liquid crystal layer is rearranged by electric fields formed between the pixel electrode and the common electrode to adjust a transmittance, such that the first and the second display panels 110 and 120 can respectively display images toward the front.

Further, the first and the second display panels 110 and 120 are electrically connected to a first printed circuit board 112 and a second printed circuit board 122, respectively, by a connecting member (not illustrated), such as a flexible printed circuit board and a tape carrier package (TCP), along at least one edge portion thereof.

The backlight unit 200 is interposed between the first and the second display panels 110 and 120 and provides light to the first and the second display panels 110 and 120 respectively so that each of the first and the second display panels 110 and 120 transmits light from the backlight unit 200.

The backlight unit 200 includes a first optical sheet 210 and a second optical sheet 220, a light guide plate 230, and a light source 240.

That is, the first optical sheet 210 is disposed on a rear surface of the first display panel 110, the second optical sheet 220 is disposed on a rear surface of the second display panel 120, the light guide plate 230 is disposed between the first and the second optical sheets 210 and 220, and the light source 240 is disposed on one side of the light guide plate 230 to face a light incident surface of the light guide plate 230.

The first and the second optical sheets 210 and 220 are configured to diffuse and/or collect light transmitted from the light guide plate 230 and may include at least one of a diffusion sheet, a prism sheet, and a protective sheet.

It is desirable that the first and the second optical sheets 210 and 220 have a structure having three sheets of the diffusion sheet, the prism sheet, and the protective sheet disposed sequentially. However, embodiments are not limited thereto, and thus a structure may vary as having two of the sheets.

The light guide plate 230 is configured to uniformly provide light supplied from the light source 240 to the first and the second display panels 110 and 120. In order to uniformly provide light, various patterns, such as an elliptical pattern, a polygonal pattern, and a hologram pattern, may be formed on at least one of a top surface and a bottom surface of the light guide plate 230 by a printing method or an injection method.

The light guide plate 230 may be formed of a light-transmissive material such as polymethylmethacrylate (PMMA) or polycarbonate (PC) so as to guide light efficiently.

The light source 240 is disposed on one side of the light guide plate 230 and configured to emit light toward a light incident surface of the light guide plate 230. The light source 240 may include at least one of an LED or a cold cathode fluorescent lamp (CCFL).

It is desirable that the light source 240 includes an LED chip including at least one LED and a package for accommodating the LED chip. However, embodiments are not limited thereto and thus the light source 240 may include a fluorescent lamp, such as a cathode fluorescent lamp and an external electrode fluorescent lamp.

A speaker unit 300 includes a first piezoelectric module 310, a second piezoelectric module 320 disposed to face the first piezoelectric module 310 and sharing an enclosure 350 with the first piezoelectric module 310, a first output unit 330 configured to output sound produced from the first piezoelectric module 310, a second output unit 340 configured to output sound produced from the second piezoelectric module 320. It is desirable that the first and the second output units 330 and 340 are disposed to face each other so as to output the sound respectively corresponding to the direction of each image displayed on the first and the second display panels 110 and 120.

The first piezoelectric module 310 may include a lower and an upper electrodes 314 and 318 respectively supported by supporters 311, and a piezoelectric element 316 disposed between the lower and the upper electrodes 314 and 318. The second piezoelectric module 320 has the same configuration as the first piezoelectric module 310, and thus a detailed description will not be provided.

The first piezoelectric module 310 may be electrically connected to the first display panel 110 through the first printed circuit board 112 and the second piezoelectric module 320 may be electrically connected to the second display panel 120 through the second printed circuit board 122.

In a case where an image signal and a sound signal are respectively transmitted from the first printed circuit board 112 to the first display panel 110 and the first piezoelectric module 310, the lower and the upper electrodes 314 and 318 of the first piezoelectric module 310 are respectively supplied with voltage, the piezoelectric element 316 then vibrates to produce sound by the supplied voltage, and then the produced sound is outputted to the first output unit 330, such that sound can be outputted in a direction B' that is the same as a display direction B of an image displayed on the first display panel 110.

Further, in a case where an image signal and a sound signal are respectively transmitted from the second printed circuit board 122 to the second display panel 120 and the second piezoelectric module 320, sound is produced from the second piezoelectric module 320 in the same method as in the first piezoelectric module 310, and then the produced sound is outputted to the second output unit 340, such that sound can be outputted in a direction A' that is the same as a display direction A of an image displayed on the second display panel 120.

More particularly, in the bidirectional display device according to an embodiment, the first and the second piezoelectric modules 310 and 320 share the enclosure 350, and thus it is not required to use an additional member to form a separate enclosure 350, thereby making the best use of space and being capable of outputting sound having a variety of tones by utilizing the enclosure 350 as a woofer.

Figure 2:
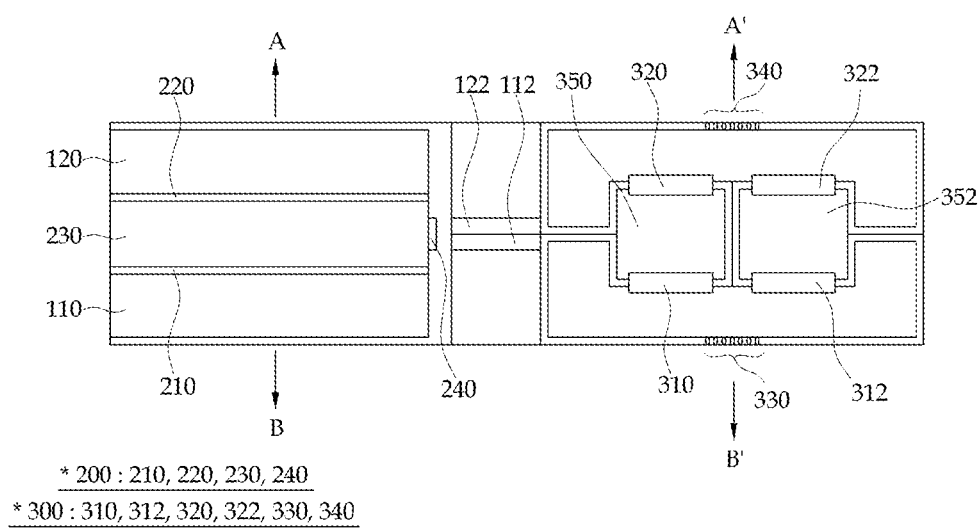
FIG. 2 is a cross-sectional plan view illustrating a bidirectional display device according to another embodiment.

Referring to FIG. 2, a bidirectional display device according to another embodiment has the same configuration as the bidirectional display device of FIG. 1 except for a speaker unit 300. Therefore, repetitive description will not be provided for ease of description.

The speaker unit 300 includes a first and a second piezoelectric modules 310 and 320 sharing a first enclosure 350, a third and a fourth piezoelectric modules 312 and 322 sharing a second enclosure 352, a first output unit 330 configured to output sound produced in the first and the third piezoelectric modules 310 and 312, and a second output unit 340 configured to output sound produced from the second and the fourth piezoelectric modules 320 and 322.

In this case, it is desirable that the first and the third piezoelectric modules 310 and 312 are disposed to face the same direction and the second and the fourth piezoelectric modules 320 and 322 are disposed to face the same direction. It is also desirable that the first enclosure 350 and the second enclosure 352 are separated from each other.

Accordingly, sound produced from the first and the third piezoelectric modules 310 and 312 is outputted to the first output unit 330 and sound outputted from the second and the fourth piezoelectric modules 320 and 322 is outputted to the second output unit 340, thereby capable of outputting sound in a stereo mode.

Figure 3:
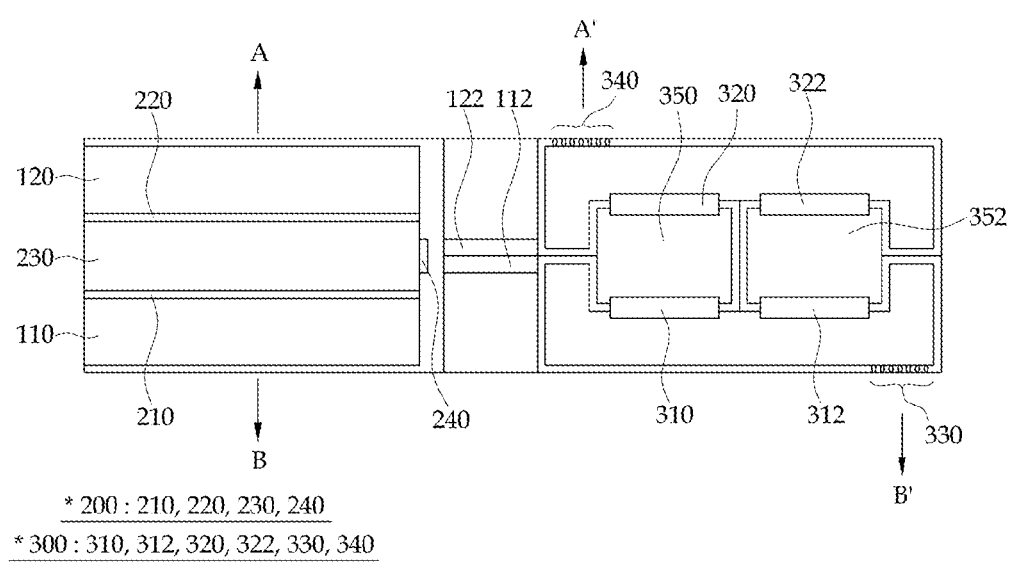
FIG. 3 is a cross-sectional plan view illustrating a bidirectional display device according to yet another embodiment.
Figure 4:
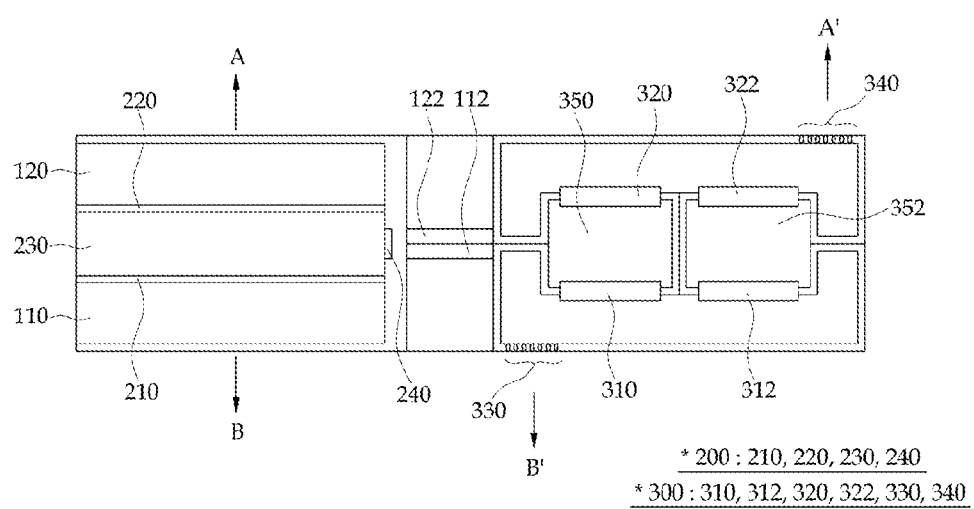
FIG. 4 is a cross-sectional plan view illustrating a bidirectional display device according to yet another embodiment.

Referring to FIGS. 3 and 4, a bidirectional display device according to yet another embodiment has the same configuration as the bidirectional display device of FIG. 2 except for a position of a first and a second output units 330 and 340 of a speaker unit 300. Therefore, repetitive description will not be provided for ease of description.

The first output unit 330 and the second output unit 340 are alternately disposed, that is, diagonally disposed to face each other, such that respective sounds outputted from the first and the second output units 330 and 340 are not mixed and can be provided to the users in accordance with each image.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

For example, in the bidirectional display device according to embodiments, the first and the second display panels are described as LCD devices; however, embodiments are not limited thereto. Thus, the first and the second display panels may have a structure including a substrate, a display layer disposed on the substrate and including an OLED, and a thin film encapsulation layer disposed to cover the display layer. In this case, a backlight unit disposed between the first and the second display panels may be omitted.

What is claimed is:

1. A display device comprising;
  a first display panel and a second display panel disposed to face each other;
  a backlight unit interposed between the first display panel and the second display panel; and
  a speaker unit disposed on one side of the backlight unit, comprising a first piezoelectric module and a second piezoelectric module sharing an enclosure and disposed to face each other, a first output unit configured to output sound produced from the first piezoelectric module, and a second output unit configured to output sound produced from the second piezoelectric module;
  wherein the first display panel and the first output unit face a first direction and the second display panel and the second output unit face a second direction different from the first direction, so as to output the sound respectively corresponding to the direction of each image displayed on the first and the second panels.

2. The display device of claim 1, wherein the first display panel and the second display panel comprises:
  a first substrate;
  a second substrate disposed to face the first substrate; and
  a liquid crystal layer interposed between the first substrate and the second substrate.

3. The display device of claim 1, wherein the backlight unit comprises:
  a first optical sheet and a second optical sheet;
  a light guide plate interposed between the first optical sheet and the second optical sheet; and
  a light source disposed on one side of the light guide plate.

4. The display device of claim 3, wherein the first optical sheet and the second optical sheet comprise at least one of a diffusion sheet, a prism sheet, and a protective sheet, and
  wherein the light source comprises at least one LED.

5. The display device of claim 1, wherein the first piezoelectric module and the second piezoelectric module each comprises:
  a lower electrode;
  an upper electrode disposed to face the lower electrode; and
  a piezoelectric element disposed between the lower electrode and the upper electrode.

6. The display device of claim 5, wherein the first piezoelectric module and the second piezoelectric module are electrically connected to the first display panel and the second display panel, respectively, and
  wherein each piezoelectric element vibrates according to voltage applied to each upper electrode and each lower electrode and produces a plurality of sounds.

7. The display device of claim 1, wherein the first output unit and the second output unit are disposed to face each other.

8. The display device of claim 7, wherein the first output unit and the second output unit are alternately disposed.

9. A display device comprising:
  a first display panel and a second display panel disposed to face each other; and
  a speaker unit disposed on one side of the first display panel, comprising a first piezoelectric module and a second piezoelectric module sharing an enclosure and disposed to face each other, a first output unit configured to output sound produced from the first piezoelectric module, and a second output unit configured to output sound produced from the second piezoelectric module;
  wherein the first display panel and the first output unit face a first direction and the second display panel and the second output unit face a second direction different from the first direction, so as to output the sound respectively corresponding to the direction of each image displayed on the first and the second panels.

10. The display device of claim 9, wherein the first display panel and the second display panel comprise:
  a substrate;
  a display layer disposed on the substrate and comprising an organic light emitting diode; and
  a thin film encapsulation layer disposed to cover the display layer.

11. The display device of claim 9, wherein the first piezoelectric module and the second piezoelectric module each comprises:
  a lower electrode;
  an upper electrode disposed to face the lower electrode; and
  a piezoelectric element disposed between the lower electrode and the upper electrode.

12. The display device of claim 11, wherein the first piezoelectric module and the second piezoelectric module are electrically connected to the first display panel and the second display panel, respectively, and
  wherein each piezoelectric element vibrates according to voltage applied to each upper electrode and each lower electrode and produces a plurality of sounds.

13. The display device of claim 9, wherein the first output unit and the second output unit are disposed to face each other.

14. The display device of claim 13, wherein the first output unit and the second output unit are alternately disposed.

15. The display device of claim 1, wherein the first display panel displays an image toward a first direction and the first output unit outputs sound in the first direction.

16. The display device of claim 1, wherein the second display panel displays an image toward a second direction and the second output unit outputs sound in the second direction.

* * * * *